(12) United States Patent
Lee et al.

(10) Patent No.: US 7,374,397 B2
(45) Date of Patent: May 20, 2008

(54) MOUNTING DEVICE FOR FANS

(75) Inventors: Hsieh Kun Lee, Tu-Chen (TW); Wanlin Xia, Shenzhen (CN); HeBen Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 798 days.

(21) Appl. No.: 10/764,200

(22) Filed: Jan. 22, 2004

(65) Prior Publication Data

US 2004/0162018 A1    Aug. 19, 2004

(30) Foreign Application Priority Data

Jan. 22, 2003    (TW) .............................. 92201181 U

(51) Int. Cl.
*F04D 29/64* (2006.01)
*F04D 29/54* (2006.01)

(52) U.S. Cl. .................................... 415/189; 415/214.1

(58) Field of Classification Search ................ 415/186, 415/189, 208.1, 209, 211.2, 213.1, 214.1; 416/244 R
See application file for complete search history.

(56) References Cited

U.S. PATENT DOCUMENTS 6,077,037 A * 6/2000 Schmidt .................. 415/213.1
6,186,889 B1 2/2001 Byrne
6,504,716 B2 * 1/2003 Huang et al. ............... 361/695
6,556,437 B1 * 4/2003 Hardin ....................... 361/687

FOREIGN PATENT DOCUMENTS

TW    313279    8/1997
TW    509458    11/2002

* cited by examiner

*Primary Examiner*—Edward K Look
*Assistant Examiner*—Nathan Wiehe
(74) *Attorney, Agent, or Firm*—Wei Te Chung

(57) ABSTRACT

A mounting device, for mounting a plurality of fans (50) to a server chassis (70), includes a tray (20), a plurality of brackets (30), and a plurality of fasteners (40). The tray includes a plurality of pairs of mounting sections each pair fixed with a corresponding bracket. Each bracket is U-shaped and includes a pair of side plates (32) for sandwiching a corresponding fan therebetween. Each bracket defines a pair of coaxial locking holes (35') in the side plates. Each fastener includes a pair of locking ends (42) received in the locking holes of a corresponding bracket to thereby sandwich the corresponding fan in the bracket. Each side plate defines an outlet (34) having a contour corresponding to a contour of an outlet of a corresponding fan, and each mounting section of the tray has a contour corresponding to a contour of the outlet of a corresponding fan.

15 Claims, 3 Drawing Sheets

MOUNTING DEVICE FOR FANS

BACKGROUND OF THE INVENTION

1. Field of the Invention

The present invention relates to a mounting device, and particularly to a mounting device which can readily and conveniently mount a plurality of fans to a server.

2. Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example by using a heat sink attached to the CPU in the enclosure. This allows the CPU and other electronic components in the enclosure to function within their normal temperature operating temperature ranges, thereby assuring the quality of data management, storage and transfer.

Oftentimes, a server comprises a plurality of electronic components installed therein. The electronic components are generally arranged in line array and only narrow space is provided between adjacent two electronic components. A plurality of heat sinks is attached on the electronic components for heat dissipating of the electronic components. A plurality of fans is installed in the server for improving heat dissipating of the heat sinks. The fans are generally separately mounted to the server. However, the server provides a small space for each fan. Thus, it is difficult and inconvenient to mount the fans to the server separately. Furthermore, leads of a fan which is desired to be mounted to the server is prone to interfere with leads of adjacent fans which are already mounted in the server.

SUMMARY OF THE INVENTION

Accordingly, an object of the present invention is to provide a mounting device which can conveniently mount a plurality of fans to a server.

To achieve the above-mentioned object, a mounting device in accordance with the present invention comprises a tray, a plurality of brackets, and a plurality of spring fasteners. The tray comprises a plurality of pairs of mounting sections each pair engaging with a corresponding bracket. Each bracket is U-shaped and comprises a pair of side plates for sandwiching a fan therebetween. Each bracket defines two pairs of coaxial locking holes in the side plates. Each fastener comprises a pair of locking ends received in the locking holes of a corresponding bracket to thereby sandwich the fan in the bracket. Each of the side plates of the bracket defines an outlet having a contour corresponding to a contour of an outlet of the fan, and each mounting section of the tray has a contour corresponding to a contour of the outlet of the fan.

Other objects, advantages and novel features of the present invention will be drawn from the following detailed description of a preferred embodiment of the present invention with attached drawings, in which:

DETAILED DESCRIPTION OF THE INVENTION

Figure 1:
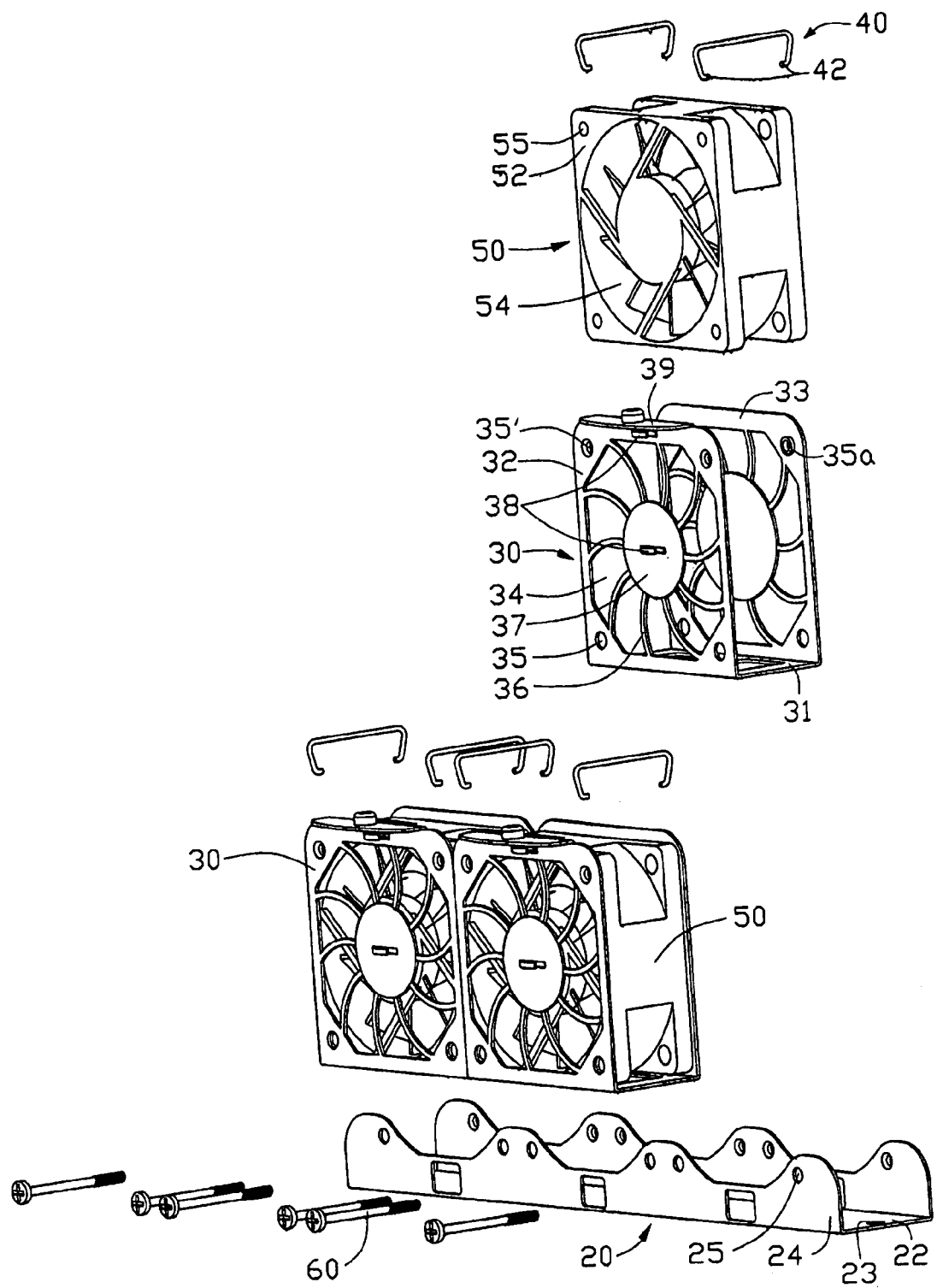
FIG. 1 is an exploded, isometric view of a mounting device in accordance with the present invention, together with three fans.
Figure 2:
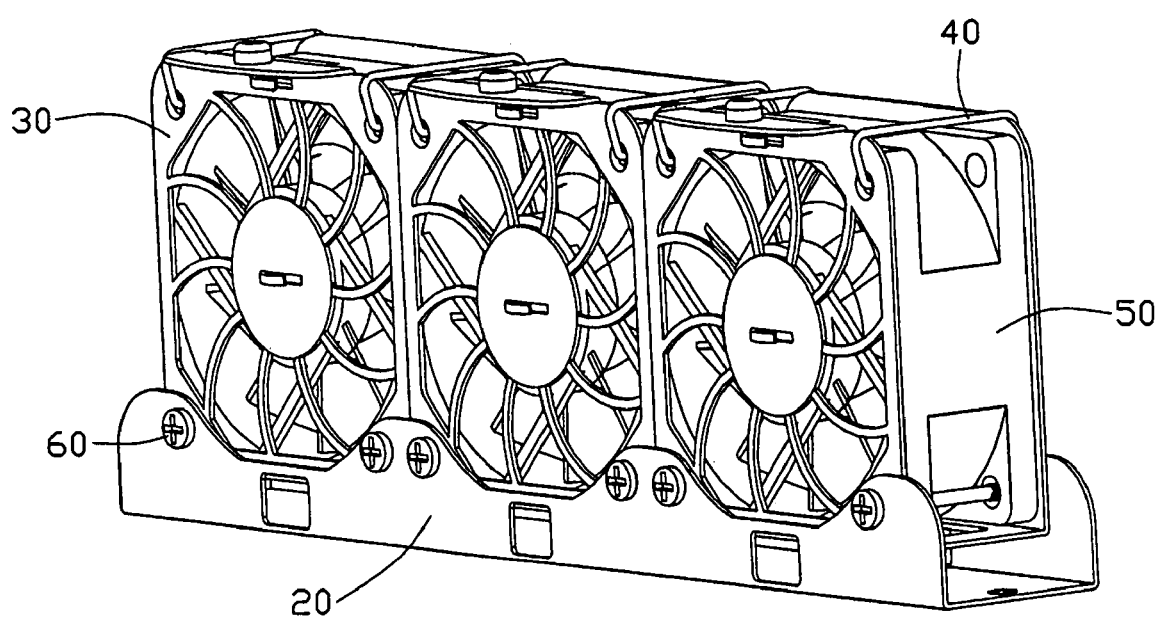
FIG. 2 is an assembled view of FIG. 1.
Figure 3:
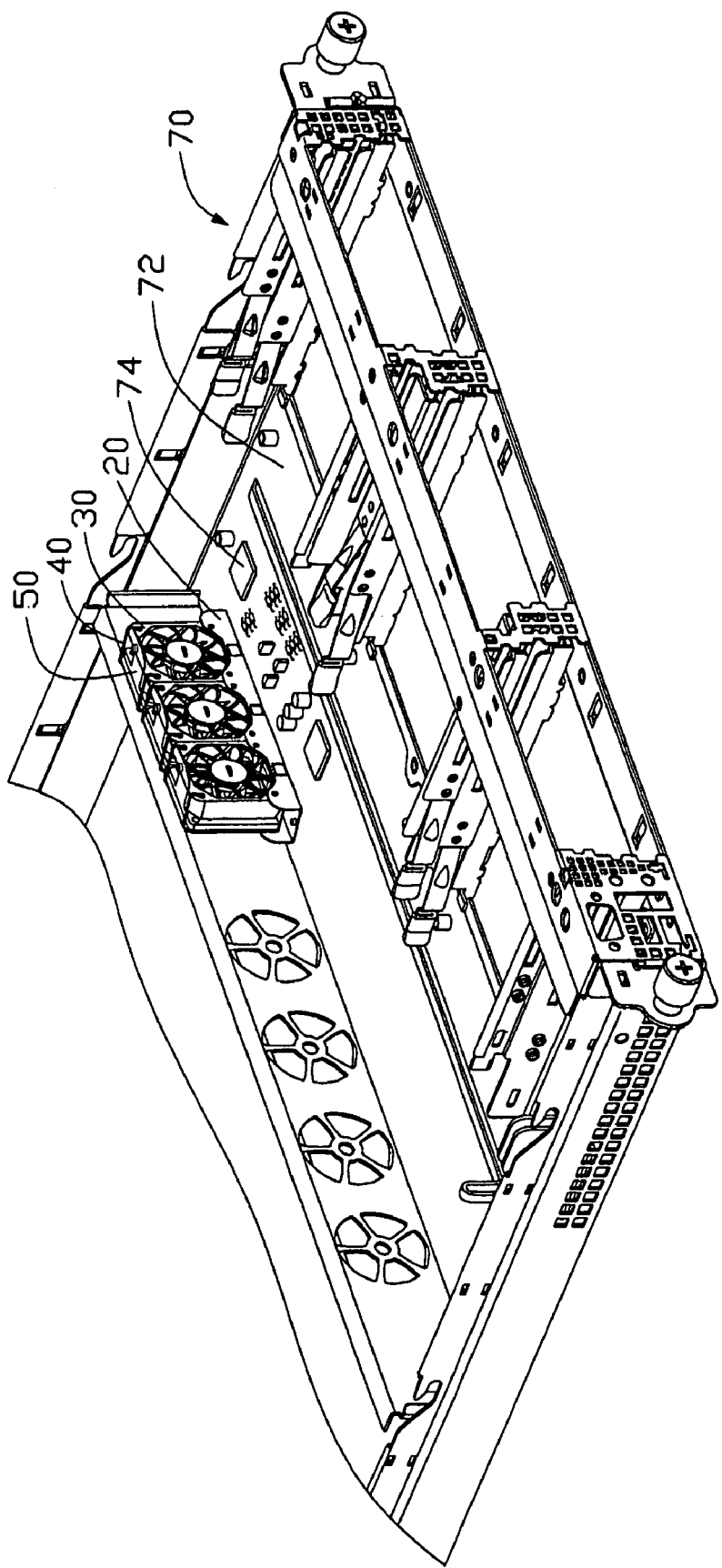
FIG. 3 is an isometric view of a server in which the mounting device and the fans of FIG. 2 is mounted.

FIGS. 1-3 show a mounting device in accordance with the preferred embodiment of the present invention, for mounting three fans 50 to a server chassis 70. Each fan 50 comprises a frame 52 and an outlet 54. Four mounting apertures 55 are defined in corners of the frame 52 respectively. The server chassis 70 comprises an electronic board 72. A plurality of electronic components is installed on the electronic board 72.

The mounting device comprises a tray 20, three brackets 30, three pairs of fasteners 40 and three pairs of bolts 60. The tray 20 has a U-shaped cross section, and comprises a bottom plate 22 and a pair of sidewalls 24 extending perpendicularly from opposite longitudinal side edges of the bottom plate 22. A plurality of through holes 23 is defined in the bottom plate 22. The sidewalls 24 comprises three pairs of mounting sections (not labeled). Each pair of mounting sections comprises two pairs of mounting holes 25. The mounting holes 25 in each pair of mounting holes 25 are aligned with each other. Contours of top edges of each mounting section correspond to a contour of the outlet 54 of a corresponding fan 50.

Each bracket 30 has a U-shaped profile, and comprises a bottom plate 31, and a pair of parallel first and second side plates 32, 33 extending upwardly from opposite longitudinal side edges of the bottom plate 31. An outlet 34 is defined in each of the side plates 32, 33, corresponding to the outlet 54 of a respective fan 50. A core 37 is defined in a center of the outlet 34. A plurality of arcuate, radial ribs 36 is arranged in the outlet 34, the ribs 36 radially extending between the core 37 and peripheral portions of the side plates 32, 33 surrounding the outlet 34. The ribs 36 help reinforce the side plates 32, 33. A supporting tab 39 is bent from a top edge of the first side plate 32, for installing an indicator light (not shown) thereon. A pair of arcuate fingers 38 is formed on an outside of an upper portion of the first side plate 32 and on an outside of the core 37 respectively, for holding leads (not shown) of the indicator light. Two pairs of mounting holes 35 are defined in lower portions of the side plates 32, 33, respectively. The mounting holes 35 in each pair of mounting holes 35 are aligned with each other. The mounting holes 35 correspond to respective mounting holes 25 of the tray 20. Two pairs of locking holes 35' are defined in upper portions of the side plates 32, 33 respectively. The locking holes 35' in each pair of locking holes 35' are aligned with each other. Two pairs of hollow positioning posts 35a are formed on insides of the side plates 32, 33 respectively; the positioning posts 35a being coaxial with respective locking holes 35'.

The fastener 40 is made by bending a metal wire so that it is generally U-shaped. The fastener 40 comprises a pair of locking ends 42, for locking in the locking holes 35' of a corresponding bracket 30. The bolts 60 are for extending through the mounting holes 25 of the tray 20, the mounting holes 35 of the brackets 30, and the mounting apertures 55 of three fans 50 to engage with screw caps (not shown).

Referring to FIG. 2, in assembly, each fan 50 is attached to a corresponding bracket 30. The fan 50 is supported on the bottom plate 31 of the bracket 30. The positioning posts 35a of the bracket 30 are received in the corresponding mounting apertures 55 of the fan 50. The mounting apertures 55 of the fan 50 are aligned with corresponding mounting holes 35 and locking holes 35' of the bracket 30. A pair of fasteners 40 is attached to the bracket 30. The locking ends 42 of the fasteners 40 are locked in corresponding locking holes 35' of the bracket 30. The fan 50 and the bracket 30 are thus pre-assembled to form a unit. Three of such units are then attached to the tray 20. The mounting holes 35 of the brackets 30 are aligned with the corresponding mounting holes 25 of the tray 20. The bolts 60 are then extended through the mounting holes 25 of the tray 20, the mounting holes 35 of the bracket 30, and the mounting apertures 55 of the fan 50 to engage with the screw caps (not shown). The fans 50 are thus attached to the mounting device.

Referring to FIG. 3, in use, the assembled fans 50 and mounting device is mounted to the server chassis 70 adjacent the electronic components 74. Fasteners (not labeled) are extended through the through holes 23 of the tray 20 to engage with the server chassis 70. Three fans 50 are thus simultaneously mounted to the server chassis 70 by way of the tray 20 and the brackets 30 of the mounting device.

In alternative embodiments of the present invention, the mounting device can comprises a plurality of brackets 30 and the tray 20 can comprise a plurality of pairs of mounting sections corresponding to the brackets 30. The brackets 30 can be integrally formed with the tray 20.

In the present invention, a plurality of the combined fans 50 and brackets 30 is firstly mounted to the tray 20. The combined tray 20, fans 50 and brackets 30 is then mounted to the server chassis 70. The chassis provide a larger space for the combination of the tray 20, the fans 50 and the brackets 30 compared to one fan of prior art. Thus, it is convenient to mount the tray 20 with the plurality of fans 50 and brackets 30 to the server chassis 70.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A mounting device for mounting fans to an electronic device chassis, the mounting device comprising:
    a tray adapted to be attached to the chassis, the tray comprising a plurality of pairs of mounting sections;
    a plurality of brackets for mounting the fans therein, each of the brackets comprising a closed end for supporting a corresponding fan thereon and an open end, the closed end being fixed with a corresponding pair of mounting sections; and
    a plurality of fasteners locking open ends of the brackets respectively to thereby cause the brackets to respectively firmly sandwich the fans therein;
    wherein each of the brackets is U-shaped and comprises a bottom plate at the closed end and a pair of side plates extending upwardly from opposite side edges of the bottom plate, and two pairs of coaxial mounting holes are defined in the aide plates adjacent the closed end;
    wherein each pair of mounting sections of the tray has a contour corresponding to a contour of an outlet of the corresponding fan and defines two pairs of coaxial mounting holes; and
    wherein a pair of bolts is extended through the mounting holes to mount said bracket to the tray.

2. The mounting device as claimed in claim 1, wherein each of the side plates defines a locking hole adjacent said open end, and each of the fasteners comprises a pair of locking ends engaging in the locking holes of the corresponding bracket.

3. The mounting device as claimed in claim 1, wherein each side plate of the bracket defines an outlet corresponding to an outlet of a corresponding fan, a core is defined in a center of the outlet, and a plurality of ribs is arranged in the outlet extending between the core and peripheral portions of the side plate surrounding the outlet.

4. The mounting as claimed in claim 3, wherein a pair of fingers is formed on the core and an upper portion of one side plate for holding leads of the fan.

5. The assembly as claimed in claim 1, wherein each of the brackets further comprises a supporting tab bent from a top edge of one of the side plates thereof, the supporting tab being adapted for installing an indicator light thereon.

6. A mounting device assembly comprising:
    a chassis providing a plurality of electronic components therein;
    a plurality of fans for improving beat dissipation of the electronic components; and
    a mounting device for mounting the fans to the chassis, the mounting device comprising:
    a tray mounted in the chassis and comprising a bottom plate and a pair of sidewalls extending perpendicularly from opposite longitudinal side edges of the bottom plate; and
    a plurality of brackets each mounting a corresponding fan therein, each of the brackets being U-shaped and comprising a bottom plate for supporting the corresponding fan thereon and a pair of side plates extending integratedly and upwardly from opposite longitudinal side edges of the bottom plate of the each bracket for covering front and rear sides of the corresponding fan;
    wherein the brackets having the fans therein are partly received in the tray, a plurality of bolts are extended through the sidewalls of the tray and the side plates of the brackets to mount the brackets to the tray, a plurality of fasteners are extended through the bottom plate of the tray to engage with the chassis.

7. The mounting device assembly as claimed in claim 6, wherein each of the brackets comprises a closed end formed by the bottom plate thereof and an open end opposing to the closed end, the corresponding fan is inserted into each of the brackets from the open end.

8. The assembly as claimed in claim 6, wherein each of the brackets further comprises a supporting tab bent from a top edge of one of the side plates thereof, the supporting tab being adapted for installing an indicator light thereon.

9. The mounting device assembly as claimed in claim 7, wherein the mounting device further comprises a plurality of fasteners locking open ends of the brackets respectively to thereby sandwich the fans in the brackets respectively.

10. The mounting device assembly as claimed in claim 9, wherein each of the side plates defines a locking hole adjacent said open end, and each of the fasteners comprises a pair of locking ends engaging in the locking holes of a corresponding bracket.

11. The mounting device assembly as claimed in claim 9, wherein each of the fans defines a pair of mounting apertures, and each of the side plates forms a post in an inner side thereof, the post being received in a corresponding mounting aperture to thereby position the fan in the corresponding bracket.

12. The mounting device assembly as claimed in claim 9, wherein each fan defines an outlet, each of the side plates defines an outlet having a contour corresponding to a contour of the outlet of a corresponding fan, and the mounting sections of the tray each having a contour corresponding to a contour of the outlet of a corresponding fan.

13. A mounting device assembly comprising:

a plurality of fans vertically side by side arranged with one another along a longitudinal direction, each of said fans defining a first rectangular dimension in a lateral direction perpendicular to said longitudinal direction, each of said fans generating air flow along said lateral direction;

a plurality of bracket units vertically side by side arranged with one another along said longitudinal direction, each of said bracket units receiving one corresponding fan therein and defining a second rectangular dimension in said lateral direction and in compliance with said first rectangular dimension, and further defining a U-shaped cross-sectional configuration in said longitudinal direction and in compliance with a thickness of said corresponding fan, each of said bracket units defining opposite outlets in opposite side plates thereof in said lateral direction;

an elongated unitary tray having a U-shaped cross-sectional configuration defining a thickness therebetween in compliance with that of the U-shaped cross-sectional configuration of the each of the bracket units, wherein at least bottom portion of said plurality of bracket units are receivably secured to the tray;

a plurality of bolts extended through said tray and the said plates of the said bracket units along said lateral direction to mount said bracket units to said tray; and a plurality of fastening devices securing each of the bracket units and the corresponding fan together;

wherein each of the bracket units further comprises a supporting tab bent from a top edge of one of the side plates thereof, the supporting tab being adapted for installing an indicator light thereon.

14. The assembly as claimed in claim 13, wherein said bracket units and said tray are discrete from each other.

15. The assembly as claimed in claim 13, wherein the bracket units are discrete from one another.

\* \* \* \* \*